US006351121B1

United States Patent
Kaplan

(10) Patent No.: US 6,351,121 B1
(45) Date of Patent: Feb. 26, 2002

(54) RAPID HIGH-ACCURACY MAGNETIC RESONANCE IMAGING

(76) Inventor: Jerome I. Kaplan, 4417 N. Pennsylvania, Indianapolis, IN (US) 46205

( * ) Notice: Subject to any disclaimer, the term of this patent is extended or adjusted under 35 U.S.C. 154(b) by 0 days.

(21) Appl. No.: 09/436,981

(22) Filed: Nov. 9, 1999

Related U.S. Application Data

(63) Continuation-in-part of application No. 09/056,518, filed on Apr. 7, 1998.

(51) Int. Cl.$^7$ .............................. Q01V 3/00
(52) U.S. Cl. ................... 324/307; 324/309; 324/300
(58) Field of Search ................ 324/307, 309, 324/300

(56) References Cited

U.S. PATENT DOCUMENTS

| | | | |
|---|---|---|---|
| 4,307,343 A | 12/1981 | Likes | 324/307 |
| 4,383,219 A | 5/1983 | Kaplan | 324/309 |
| 4,642,567 A | 2/1987 | Kaplan | 324/309 |
| 5,270,654 A | * 12/1993 | Feinburg et al. | 324/300 |
| 5,422,576 A | * 6/1995 | Kao | 324/309 |
| 6,081,118 A | * 7/2000 | Kaplan | 324/307 |

OTHER PUBLICATIONS

Deconvolution of Images and Spectra (pp. ii–xiv, 1–41 and 76–113), Peter A. Jansson, Academic Press, San Diego, 1984.
Spatial Encoding and Image Reconstruction, Stephen J. Riederer, 1992 AAPM Summer School Proceedings, American Institute of Physics, 1992.
Processing Images in Frequency Space (pp. 331–341) & Reference (pp. 659–668), The Image Processing Handbook, 2nd Edition, John C. Russ, CRC Press, Boca Raton, 1995.

(List continued on next page.)

Primary Examiner—Jay Patidar
Assistant Examiner—Brij B. Shrivastav
(74) Attorney, Agent, or Firm—Integral Patent Associates

(57) ABSTRACT

Methods for increasing the imaging accuracy of object density pixel values by forming linear combinations thereof to counteract spatial mixing of object density pixel value information, and by using an estimate of the object density pixel values to correct for the effects of variations in the object density. A measured variable M as a function of time t is related to the actual object density $\varrho$ by $M(t) = \int F(\varrho(q), q, t) \varrho(q) dq$, where q is the spatial variable. An estimated object density $\varrho^*$ is related to an actual object density $\varrho$ by $$\varrho(q) = \int \Sigma_t E([\varrho], q, t) F(\varrho, q', t) \varrho(q') dq',$$

where E is an approximate inverse of F, and $\Sigma_t E([\varrho], q, t) F(\varrho, q', t)$ is defined as the kernel function $A(q, q')$. Due to the limited number of time samples, the kernel A only approximates the delta function $\delta(q-q')$, and values of $\varrho(q')$ away from $q=q'$ contribute to $\varrho^*(q)$. An improved-accuracy object density $\varrho^{}(q)$ is therefore obtained as $$\varrho^{}(q_i) = \Sigma_j (B^{-1})_{ij} \varrho^*(q_j),$$

where the kernel matrix B is a discretized version of the kernel function A. For magnetic resonance imaging, the predominant L-dependence of E and F is through the dependence of the transverse relaxation time $T_2$ on the object density $\varrho$. The boundaries of the ischemic- and normal-tissue regions of the myocardium may be determined from the estimated object density $\varrho^*(q)$ or from the improved-accuracy object density $\varrho^{**}(q)$. Based on the locations of these regions, a corrected transform $E_c(t)$, which takes the spatial dependence of the transverse relaxation time into account, may be used to obtain a corrected estimated object density $\varrho_c^*(q)$ according to $$\varrho_c^*(q) = \Sigma_t E_c([\varrho], q, t) M(t).$$

15 Claims, 8 Drawing Sheets

OTHER PUBLICATIONS

Echo–Planar Imaging (pp. 141–147), Franz Schmitt, Michael K. Stehling & Robert Turner, Springer–Verlag, Berlin 1998.

NMR—A perspective on imaging, General Electric, (pre. 1989).

NMR imaging in theory and in practice (Sections 2–5 & References, pp. 635–670), D.G. Taylor, R. Inamdar & M–C. Bushell, Phys. Med. Biol., vol. 33, No. 6, IOP Publishing Ltd. U.K., 1988.

Prolongation of Proton Spin Lattice Relaxation Times in Regionally Ischemic Tissue from Dog Hearts, E.S. Williams, J.I. Kaplan, F. Thatcher, G. Zimmerman & S.B. Knoebel, Journal of Nuclear Medicine, vol. 21, No. 5, pp. 449–453, 1980.

Parameters Determining the Appearance of NMR Images (pp. 81–82 and 99–103), F.W. Wehrli, J.R. MacFall & T.H. Newton, General Electric, 1984.

Image Restoration Models (Chapter 13, pp. 345–377), Digital Image Processing, William K. Pratt, John Wiley & Sons, New York, 1978.

Magnetic resonance imaging in cardiology: current status and perspectives, Francesco Fedele, Paolo Di Renzi, Ernesto Di Cesare, Cardiologia (pp. 595–611), vol. 41 (7), 1996.

* cited by examiner

RAPID HIGH-ACCURACY MAGNETIC RESONANCE IMAGING

RELATED APPLICATIONS

The present application is a continuation-in-part of parent application Ser. No. 09/056,518, filed Apr. 7, 1998, of the same title and by the same inventor.

BACKGROUND OF THE INVENTION

The present invention is directed to magnetic resonance imaging (MRI) apparatus and methods, and particularly to apparatus and methods which increase the accuracy and/or resolution of MRI images, and/or decrease the time required to obtain an MRI image.

MRI is based on solving the Bloch Equations $$dM_x/dt = -\gamma H_z M_y - M_x/T_2, \quad (1.1)$$

$$dM_y/dt = -\gamma H_z M_x - M_y/T_2, \quad (1.2)$$

and $$dM_z/dt = -(M_0 - M_z)/T_1, \quad (1.3)$$

which gives the magnetization $M = M_x x + M_y y + M_z z$ of magnetic nuclei (typically protons) in the presence of a magnetic field $H = H_z z$. Standard nuclear magnetic resonance (NMR) uses a homogeneous magnetic field, but to obtain the spatial resolution required for image mapping, gradient magnetic fields must be added. The interaction of the magnetic spins with the environment is given in terms of the transverse relaxation time $T_2$ which determines the rate of decay of the $M_x$ and $M_y$ components of the magnetization M to zero, and the longitudinal relaxation time $T_1$ which determines the rate of decay of the $M_z$ component of the magnetization M to the value $M_0$. It has been previously shown (Prolongation of Proton Spin Lattice Relaxation Times in Regionally Ischemic Tissue from Dog Hearts, E. S. Williams, J. I. Kaplan, F. Thatcher, G. Zimmerman and S. B. Knoebel, Journal of Nuclear Medicine, May 1980, Vol. 21, No. 5) that $T_1$ is different in normal and ischemic heart muscle by about 10%. Using the inversion recovery technique (which is described in detail in U.S. Pat. No. 4,383,219, entitled Nuclear Magnetic Resonance Spatial Mapping, issued May 10, 1983 to Jerome I. Kaplan, and is incorporated herein by reference) the 10% difference in the relaxation times can be amplified into a 25% differentiation in the magnetization in the normal and ischemic regions of the heart. Thus mapping this difference in magnetization allows for a mapping of the normal and ischemic regions of the heart.

High-resolution MRI images of non-moving body parts are routinely obtained. However, an added difficulty with the heart arises from its large scale rapid motion at about one beat per second. To avoid blurring, the MRI image must therefore be obtained in less than 1/20th of a second.

As is shown in the present specification, standard mapping procedures do not permit a high-resolution mapping for times of less than 1/20th of a second. An advantage of the present invention is that high-resolution images may be obtained for mappings where the data is acquired in a short period of time.

The mapping procedure of the present invention is as follows:

1) A radio frequency pulse or pulse sequence rotates the magnetization $M(x,y)$ of the actual object density $\rho(x,y)$ from its equilibrium direction along the z-axis (i.e., the direction of the large applied static magnetic field) to the x-y plane. The magnetization $M(x,y)$ precesses at a frequency $\omega(x,y)$ about the local gradient fields at position $(x,y)$.

2) The total magnetization is recorded by monitoring the induced voltage in the receiver coils. The relation between the total magnetization M and the actual object density $\rho(x,y)$ is described by the transform $F(t,x,y)$ according to $$M(t) = \int F(t,x,y)\rho(x,y)dxdy, \quad (1.4)$$

3) An estimated mapping object density $\rho^*(x,y)$ is obtained from the magnetization $M(t)$ by application of a transform E according to $$\rho^*(x,y) = \Sigma_t E(t,x,y)M(t). \quad (1.5)$$

For long mapping times, the estimated object density $\rho^*(x,y)$ is a relatively accurate map of the actual object density $\rho(x,y)$ using this standard procedure. However, for shorter mapping times, the estimated object density $\rho^*(x,y)$ becomes a less accurate mapping of the actual object density $\rho(x,y)$.

In a first preferred embodiment, the present invention therefore includes the following additional steps:

4A) A kernel function A which describes the relationship between the estimated object density $\rho^*(x,y)$ and the actual object density $\rho(x,y)$ is estimated, i.e., $$\rho^*(x,y) = \int A(x,y,x'y')\rho(x',y')dx'dy', \quad (1.6)$$

where the kernel function is given by $$A(x,y,x'y') = \Sigma_t E(t,x,y)F(t,x',y'). \quad (1.7)$$

5A) The kernel function A is discretized to form a kernel matrix B describing the relationship between the estimated object density pixel values $\rho^*(x,y)$ and the actual object density pixel values $\rho(x,y)$, i.e., $$\rho^*(x,y) = \sum_{x',y'} B(x,y,x',y')\rho(x',y'). \quad (1.8)$$

6A) The inverse of the kernel matrix B is applied to the estimated object density $\rho^*(x,y)$ to produce an increased-accuracy object density $\rho^{}(x,y)$ which more accurately represents the actual object density $\rho(x,y)$, i.e., $$\rho^{}(x,y) = \sum_{x',y'} B^{-1}(x',y')\rho^*(x',y'). \quad (1.9)$$

This procedure allows for high-resolution mapping of a moving subject, such as an organ like the heart. It should also be noted that the application of the inverse of the kernel matrix B to the estimated object density $\rho^*(x,y)$ to provide the increased-accuracy object density $\rho^{**}(x,y)$ is also useful in producing increased accuracy images in situations where there are no time constraints.

In a second preferred embodiment of the present invention, information regarding the object density is utilized to increase the accuracy of the estimate of the transform $E(t,x,y)$. The second preferred embodiment of the present invention therefore includes the following additional steps:

4B) Ischemic and normal regions of the myocardium are mapped according to the estimated object density $\rho^*(x,y)$.

5B) The transform E(t,x,y) is corrected to form corrected transform $E_c$(t,x,y) based on the locations of the ischemic and normal regions of the myocardium obtained from the estimated object density $\rho^*$(x,y).

6B) The corrected transform $E_c$(t,x,y) is used to calculate a corrected estimated object density $\rho_c^*$(x,y) according to $$\rho_c^*(x,y) = \Sigma_t E_c(t,x,y) M(t). \qquad (1.10)$$

According to a third preferred embodiment of the present invention a combination of the techniques of the first two preferred embodiments is used. The process of the third preferred embodiment of the present invention includes a modification of step 3, described above, as follows:

3C) A current-best estimated object density $\rho_b^*$(x,y) is obtained from the magnetization M(t) by application of a current-best transform $E_b$ according to $$\rho_b^*(x,y) = \Sigma_t E_b(t,x,y) M(t). \qquad (1.11)$$

The currently-best transform $E_b$ is based on an average value of the actual object density $\rho$, unless a corrected transform $E_c$ based on an estimation of the normal and ischemic regions has been calculated. Furthermore, the process of the third preferred embodiment of the present invention includes the following steps:

4C) When an estimated object density $\rho^*$(x,y) is calculated or updated to provide a current-best estimated object density $\rho_b^*$(x,y), then a choice is made to either (i) use the current-best estimated object density $\rho_b^*$(x,y) to produce an estimate of the ischemic and normal regions, as described in step 6C below, or (ii) use the current-best estimated object density $\rho_b^*$(x,y) to produce a current-best corrected object density $\rho_b^{**}$(x,y), as described in step 5C below.

5C) The inverse of a best kernel matrix $B_b$ is applied to the current-best estimated object density $\rho_b^*$(x,y) to produce a current-best increased-accuracy object density $\rho_b^{}$(x,y), which more accurately represents the actual object density $\rho$(x,y), according to $$\rho_b^{}(x,y) = \sum_{k,l} [B_b(x,y,x',y')]^{-1} \rho_b^*(x,y), \qquad (1.12)$$

where the current-best kernel matrix $B_b$ uses the inital estimate of the transform E based on an average value of the actual object density $\rho$, unless a corrected transform $E_c$ based on estimated normal and ischemic regions has been calculated.

OR

6C) Ischemic and normal regions of the myocardium are mapped based on the current-best estimated object density $\rho_b^*$(x,y) or the current-best improved-accuracy object density $\rho_b^{**}$(x,y)

7C) A corrected transform $E_c$(t,x,y) is calculated based on current-best estimation of the ischemic and normal regions of the myocardium.

Therefore, it is an object of the present invention to provide apparatus and method for magnetic resonance imaging which increases the accuracy of magnetic resonance images.

It is another object of the present invention to provide apparatus and method for magnetic resonance imaging which improves the spatial resolution of magnetic resonance images.

It is another object of the present invention to provide apparatus and method for magnetic resonance imaging which decreases the time required to obtain magnetic resonance images.

It is another object of the present invention to provide apparatus and method for utilizing information regarding ischemic and normal regions of the myocardium in the improvement of the spatial resolution of magnetic resonance images and/or the reduction in time required to obtain magnetic resonance images.

It is another object of the present invention to provide method and apparatus of efficient solution of an increased-accuracy object density.

It is another object of the present invention to provide method and apparatus of solution of an increased-accuracy object density for regions where relationships between actual object density and estimated object density are roughly translationally invariant.

Further objects and advantages of the present invention will become apparent from a consideration of the drawings and the ensuing detailed description.

SUMMARY OF THE INVENTION

The present invention is directed to a method for producing increased-accuracy object density $\varrho^{**}$ of an object from estimated object density $\varrho^*$ by compensating for a spatial mixing of object density data involved in an initial estimation of the object density from the magnetization data. Data values M extracted from the object are related to the integration of the actual object density $\varrho$ over one-, two-, or three-dimensional space with a weighting by a transform function F, i.e., $$M(t) = \int F(q,t) \varrho(q) dq, \qquad (2.1.1)$$

where q is a coordinate vector in the space. The estimated object density $\varrho^*$ is related to the data values M(t) by the transform, $$\varrho^*(q) = \Sigma_t E(q,t) M(t), \qquad (2.1.2)$$

where transform E(q,t). Therefore, the actual object density is related to the estimated object density by the relationship $$\varrho^*(q) = \int A(q,q') \varrho(q') dq', \qquad (2.1.3)$$

where A(q,q') is a kernel function given by $$A(q,q') = \Sigma_t F(q',t) E(q,t), \qquad (2.1.4)$$

which approximates, but is not equal to, a delta function $\delta(q-q')$, and therefore values of the actual object density $\varrho(q')$ away from q'=q contribute to $\varrho^*(q)$. The increased-accuracy object density $\varrho^{}$ is obtained by the relationship $$\varrho^{}(q) = \Sigma_q B^{-1}(q,q') \varrho(q'), \qquad (2.1.5)$$

where B(q,q') is a discretized version of A(q,q').

The present invention is also directed to a method for producing a correction in the calculation of an approximation of the actual object density $\varrho$ based on magnetization data M using object density approximations to estimate the normal and ischemic regions. Magnetization data values M extracted from the object are related to the integration of the actual object density $\varrho$ over one-, two-, or three-dimensional space via transform function F according to $$M(t) = \int F(\varrho(q),q,t) \varrho(q) dq, \qquad (2.2.1)$$

where q is a coordinate vector in the space. The estimated object density $\varrho^*$ is related to the data values M(t) by the transform, $$\varrho^*(q)=\Sigma_t E([\varrho],q,t)M(t), \qquad (2.2.2)$$

where the square brackets indicate that a characteristic value of the variable within is used. Using the estimated object density $\varrho^*(q)$, a corrected transform $E_c$ is generated, i.e., $$E_c=E(\varrho^*(q),q,t). \qquad (2.2.3)$$

Corrected estimated object density pixel values $\varrho_c^*$ are then calculated according to $$\varrho_c^*(q)=\Sigma_t E_c(t)M(t). \qquad (2.2.4)$$

Furthermore, the present invention is directed to a method for producing second (or even higher) order corrections in the calculation of an approximation of the actual object density $\varrho$ based on magnetization data M using object density approximations to estimate the normal and ischemic regions and, optionally, compensating for a spatial mixing of object density data involved in an initial estimation of the object density from the magnetization data. Data values M extracted from the object are related to the integration of the actual object density $\varrho$ over one-, two-, or three-dimensional space q with a weighting by a transform function F, i.e., $$M(t)=\int F(\varrho,q,t)\varrho(q)dq. \qquad (2.3.1)$$

An estimated object density $\varrho^*$ is related to the data values M by the transform, $$\varrho^*(q)=\Sigma_t E([\varrho],q,t)M(t), \qquad (2.3.2)$$

where the square brackets indicate that a characteristic value of the variable within is used. Therefore, the estimated object density $\varrho^*$ is related to the actual object density $\varrho$ by $$\varrho^*(q)=\int A(q,q')\varrho(q')dq', \qquad (2.3.3)$$

where A(q,q') is a kernel function given by $$A(q,q')\equiv \Sigma_t E([\varrho],q,t)F(\varrho(q'),q',t), \qquad (2.3.4)$$

which approximates, but is not equal to, a delta function $\delta(q-q')$, and therefore values of the actual object density $\varrho(q')$ away from q'=q contribute to $\varrho^*(q)$. An increased-accuracy object density $\varrho^{}$ is obtained by the relationship $$\varrho^{}(q)=\Sigma_{q'}B^{-1}(q,q')\varrho(q'), \qquad (2.3.5)$$

where B(q,q') is a discretized version of A(q,q'). Using the increased-accuracy object density $\varrho^{}(q)$, a corrected transform $E_c$ is generated, i.e., $$E_c=E(\varrho^{}(q),q,t). \qquad (2.3.6)$$

A corrected increased-accuracy object density $\varrho_c^{**}$ is then calculated according to $$\varrho_c^*(q)=\Sigma_t E_c M(t). \qquad (2.3.7)$$

The present invention is also directed to a method for producing a correction in the calculation of an approximation of the actual object density $\varrho$ based on magnetization data M using object density approximations to estimate the normal and ischemic regions. Magnetization data values M extracted from the object are related to the integration of the actual object density $\varrho$ over one-, two-, or three-dimensional space via transform function F according to $$M(t)=\int F(\varrho(q),q,t)\varrho(q)dq, \qquad (2.4.1)$$

where q is a coordinate vector in the space. The estimated object density $\varrho^*$ is related to the data values M(t) by the transform, $$\varrho^*(q)=\Sigma_t E([\varrho],q,t)M(t), \qquad (2.4.2)$$

where the square brackets indicate that a characteristic value of the variable within is used. Using the estimated object density $\varrho^*(q)$, a corrected transform $E_c$ is generated, i.e., $$E_c=E(\varrho^*(q),q,t). \qquad (2.4.3)$$

Corrected estimated object density pixel values $\varrho_c^*$ are then calculated according to $$\varrho_c^*(q)=\Sigma_t E_c M(t). \qquad (2.4.4)$$

Using the corrected estimated object density $\varrho_c^*(q)$, a second-order corrected transform $E_{cc}$ is generated, i.e., $$E_{cc}=E(\varrho_c^*(q),q,t), \qquad (2.4.5)$$

and a second-order corrected estimated object density $\varrho_{cc}^*$ is then calculated according to $$\varrho_{cc}^*(q)=\Sigma_t E_{cc} M(t). \qquad (2.4.6)$$

The present invention is also directed to a method for producing a correction in the calculation of an approximation of the actual object density $\varrho$ based on magnetization data M using object density approximations to estimate the normal and ischemic regions. Magnetization data values M extracted from the object are related to the integration of the actual object density $\varrho$ over one-, two-, or three-dimensional space via transform function F according to $$M(t)=\int F(\varrho(q),q,t)\varrho(q)dq, \qquad (2.5.1)$$

where q is a coordinate vector in the space. The estimated object density $\varrho^*$ is related to the data values M(t) by the transform, $$\varrho^*(q)=\Sigma_t E([\varrho],q,t)M(t), \qquad (2.5.2)$$

where the square brackets indicate that a characteristic value of the variable within is used. Using the estimated object density $\varrho^*(q)$, a corrected transform $E_c$ is generated, i.e., $$E_c(q,t)=E(\varrho^*(q),q,t). \qquad (2.5.3)$$

Corrected estimated object density pixel values $\varrho_c^*$ are then calculated according to $$\varrho_c^*(q)=\Sigma_t E_c(q,t)M(t). \qquad (2.5.4)$$

A corrected kernel function $A_c(q,q')$ is given by $$A_c(q,q')=\Sigma_t F(q',t)E_c(q,t), \qquad (2.5.5)$$

and an increased-accuracy corrected object density $\varrho_c^{}$ is obtained by the relationship $$\varrho_c^{}(q)=\Sigma_{q'}[B_c(q,q')]^{-1}\varrho_c^*(q'), \qquad (2.5.6)$$

where $B_c(q,q')$ is a discretized version of $A_c(q,q')$.

BRIEF DESCRIPTION OF THE DRAWINGS

The accompanying drawings, which are incorporated in and form a part of the present specification, illustrate embodiments of the invention and, together with the Detailed Description of the Preferred Embodiments, serve to explain the principles of the invention.

DETAILED DESCRIPTION OF THE PREFERRED EMBODIMENTS

Figure 3A:
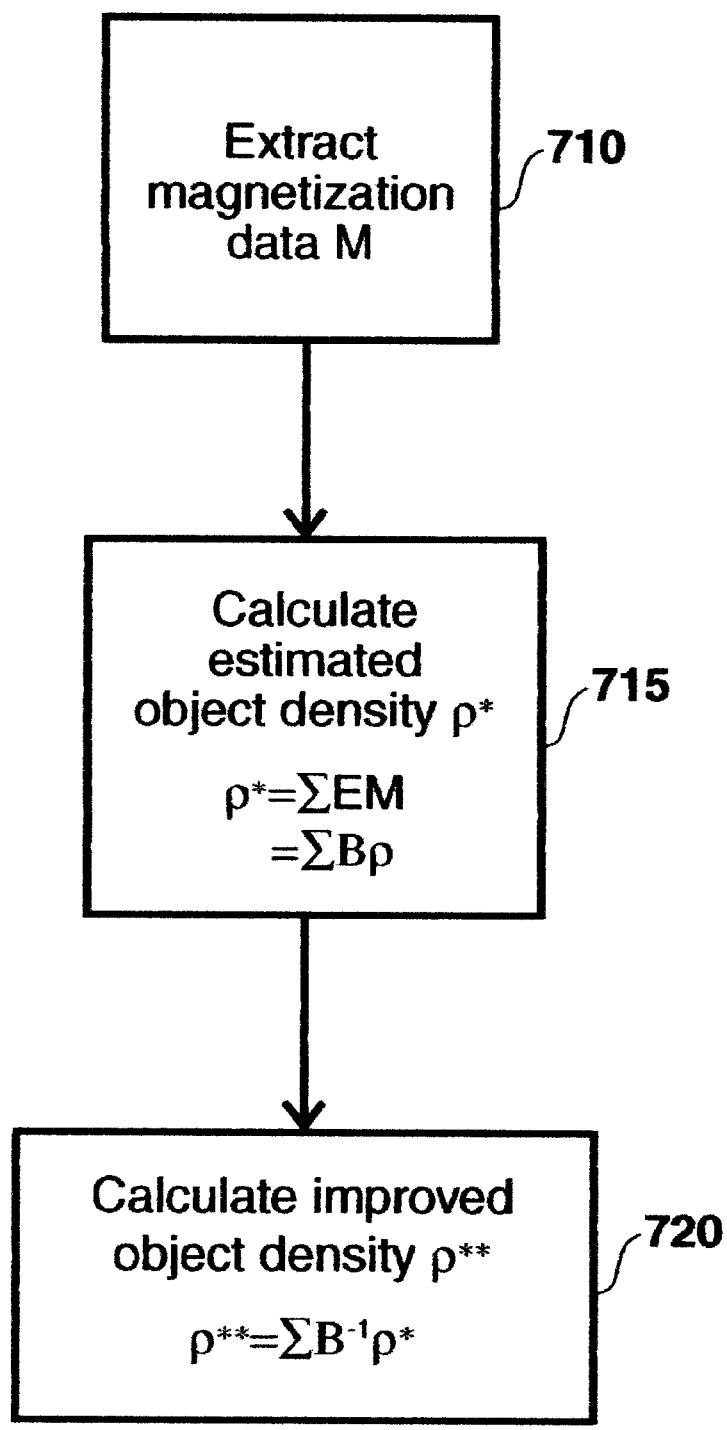
FIG. 3A is a flowchart depicting a method of the present invention.
Figure 3B:
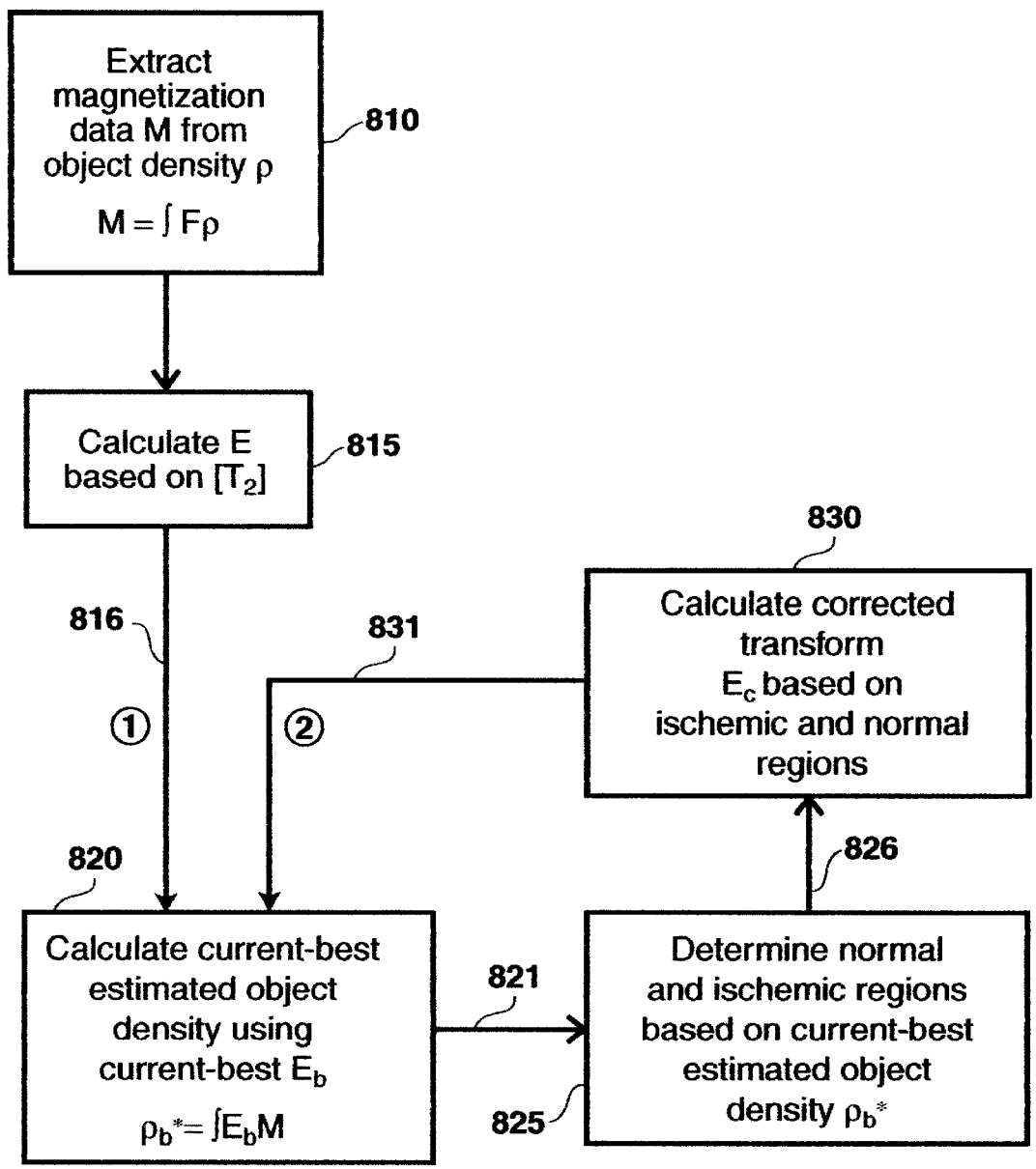
FIG. 3B is a flowchart depicting a second method of the present invention.
Figure 3C:
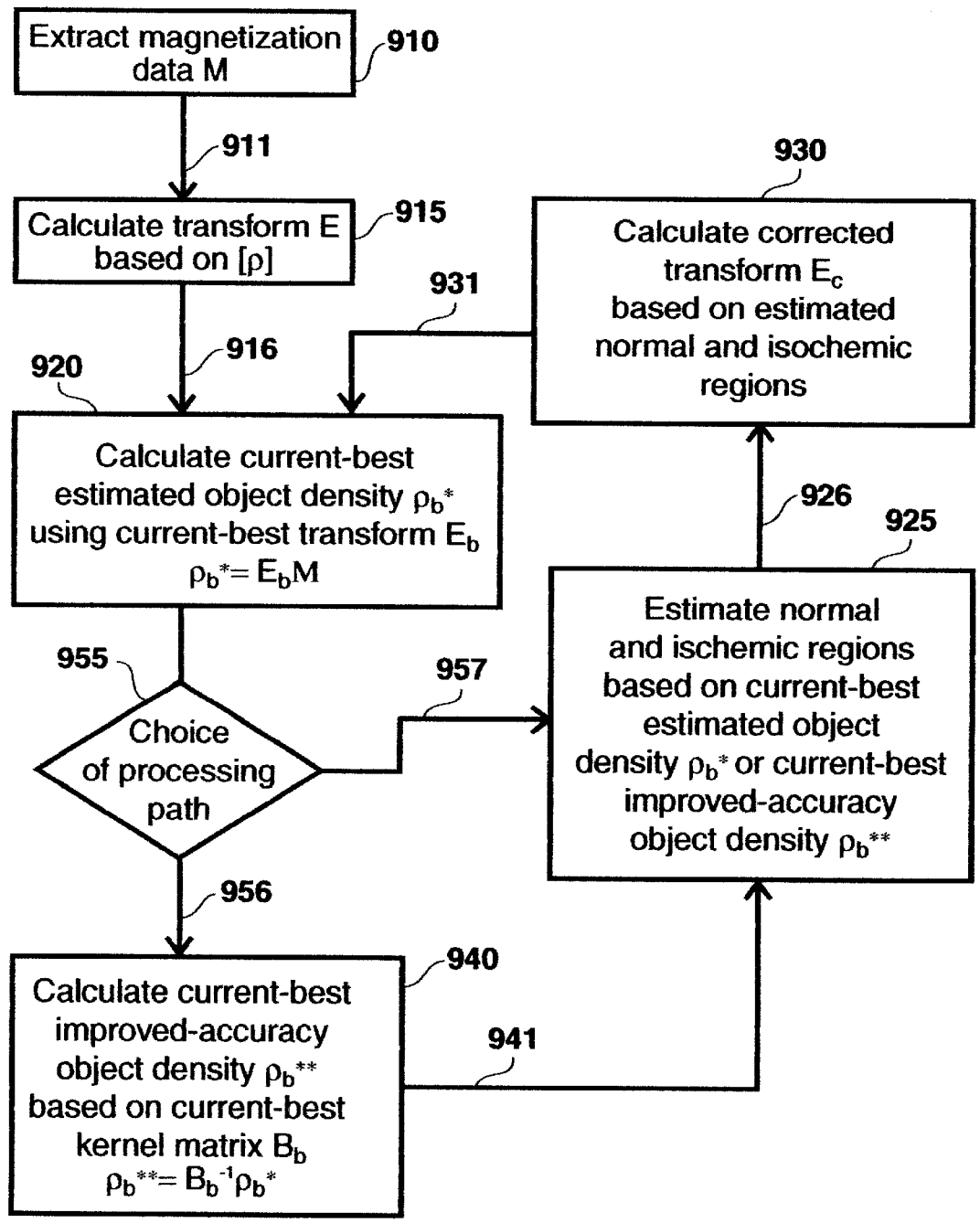
FIG. 3C is a flowchart depicting a combination of the first and second methods of FIGS. 3A and 3B.

As shown in the flowcharts of FIGS. 3A, 3B and 3C, the methods of the present invention begin with the extraction of magnetic data 710, 810 and 910 from the object under study. In the case of MRI imaging, the data values are currents induced in solenoid coils, and from the induced currents the magnetization of the object can be inferred.

The general solution of the Bloch Equations for the magnetization in the x-y plane is obtained by by multiplying equation (1.2) by the complex number i and adding it to equation (1.1) to provide $$dM/dt = i\gamma H_z M - M/T_2 \qquad (3.1)$$

where $$M \equiv M_x + iM_y. \qquad (3.2)$$

Once the magnetization in a selected plane has been rotated to the x-y plane, the magnetic field gradient along the z-axis is removed, and gradients $q_x \equiv \partial H_z/\partial x$ and $q_y \equiv \partial H_z/\partial y$ in the x- and y-directions, respectively, are applied, i.e., $$H_z(x,y) = H_0 + q_x x + q_y y. \qquad (3.3)$$

As can be verified by direct substitution, the solution of equation (3.1) is $$M(t, x, y) = M_0 e^{(i\omega_0 - 1/T_2)t} e^{i\gamma q_x x t} e^{i\gamma q_y y t}. \qquad (3.4)$$

If the x-gradient is applied for a period of time $t_1$, during which time there is no y-gradient, then $$M(t_1, x, y) = M_0 e^{(i\omega_0 - 1/T_2)t_1} e^{i\gamma q_x x t_1}. \qquad (3.5)$$

at the end of this period. If a gradient is then applied along the y-axis for time $t_1$ to $t \equiv t_1 + t_2$, during which time there is no x-gradient, the magnetization at time t is given by $$M(t, x, y) = M_0 e^{(i\omega_0 - 1/T_2)t} e^{i\gamma q_x x t_1} e^{i\gamma q_y y t_2}. \qquad (3.6)$$

However, it is only the magnetization integrated over the activated region, i.e., $$M(t) = \int \varrho(x,y) M(t,x,y) dx\, dy, \qquad (3.7)$$

that can be directly measured, where $\varrho(x,y)$ is the actual object density. Whereas the object density $\varrho(x,y)$ may simply be the density of hydrogen nuclei in water and fat for a method consisting simply of a 90° pulse followed directly by data acquisition, in the case of the inversion recovery method the object density $\varrho(x,y)$ is the magnetization subsequent to a 180° pulse, a waiting period on the order of $T_1$, and a 90° pulse, as discussed above.

If the expression for M(t) of equation (3.6) (where the x-gradient in the magnetic field is applied from time 0 to time $t_1$, and the y-gradient in the magnetic field is applied from time $t_1$ to time $t \equiv t_1 + t_2$) is substituted into equation (3.7) the magnetization is given by $$M(t) = M_0 e^{(i\omega_0 - 1/T_2)t} \int \varrho(x, y) e^{i\gamma q_x x t_1} e^{i\gamma q_y y t_2} dx\, dy, \qquad (3.8)$$

where the assumption has been made that $T_2$ is independent of position so the factor $\exp[(i\omega_0 - 1/T_2)t]$ may be taken outside the integral. If $t_1$ and $t_2$ are defined as $t_1 = n_1 \Delta t$ and $t_2 = n_2 \Delta t$, where $\Delta t$ is the dwell time and $n_1$ and $n_2$ are integers, then equation (3.8) becomes $$M(n_1, n_2) = \qquad (3.9)$$
$$M_0 e^{(i\omega_0 - 1/T_2)(n_1+n_2)\Delta t} \int \varrho(x, y) e^{i\gamma q_x x n_1 \Delta t} e^{i\gamma q_y y n_2 \Delta t} dx\, dy.$$

If the data acquisition 710, 810 and 910 of FIGS. 3A, 3B and 3C is implemented by recording the magnetization $M(n_1,n_2)$ for $n_1 = 0,1,2,\ldots,N_x$ and $n_2 = 0,1,2,\ldots,N_y$ (i.e., there are $W \equiv N_x \times N_y$ recording times), then calculation 715, 815 and 915 of an estimated object density $\varrho$ at coordinates $(x^*, y^*)$ is given by $$\varrho^*(x, y) = \mathrm{Real}\left\{ \sum_{n_1=0}^{N_x} \sum_{n_2=0}^{N_y} e^{-(i\omega_0 - 1/T_2)(n_1+n_2)\Delta t} e^{-i\gamma q_x x n_1 \Delta t} e^{-i\gamma q_y y n_2 \Delta t} M(n_1, n_2) \right\} \qquad (3.10)$$

The approximate nature of $\varrho^*(x,y)$ of equation (3.10) for the object density value $\varrho(x,y)$ of this stage 715 of the method of the present invention is clarified by substitution of equation (3.9) into equation (3.10) to provide $$\varrho^*(x,y) = M_0 \int \varrho(x^*,y^*) \mathrm{Real}\{A(x-x^*, y-y^*)\} dx^*\, dy^* \qquad (3.11)$$

where $$A \equiv A(x - x^*, y - y^*) \quad (3.12)$$

$$= \left(\sum_{n_1=0}^{N_x} e^{i\gamma q_x n_1 \Delta t (x-x^*)}\right)\left(\sum_{n_2=0}^{N_y} e^{i\gamma q_y n_2 \Delta t (y-y^*)}\right).$$

Expansion of the sums of equation (3.12) and use of trigonometric identities provides $$\text{Real}\{A\} = A^{(1)}(\alpha_x, N_x) A^{(1)}(\alpha_y, N_y) - A^{(2)}(\alpha_x, N_x) A^{(2)}(\alpha_y, N_y) \quad (3.13)$$

where $$A^{(1)}(\alpha, N) \equiv \frac{(1 - \cos(\alpha(N+1))) \cdot (1 - \cos\alpha) + \sin(\alpha(N+1)) \cdot \sin\alpha}{(1 - \cos\alpha)^2 + \sin^2\alpha} \quad (3.14.1)$$

$$A^{(2)}(\alpha, N) \equiv \frac{(1 - \cos(\alpha(N+1))) \cdot \sin\alpha - \sin(\alpha(N+1)) \cdot (1 - \cos\alpha)}{(1 - \cos\alpha)^2 + \sin^2\alpha} \quad (3.14.2)$$

where $$\alpha = \gamma q_r \Delta t (r - r^*) = \gamma q_r \Delta t \Delta r \quad (3.14.3)$$

and r is a generic spatial variable for which x or y may be substituted, i.e., $$\alpha_x = \gamma q_x \Delta t (x - x^*) = \gamma q_x \Delta t \Delta x \quad (3.14.3.1)$$

and $$\alpha_y = \gamma q_y \Delta t (y - y^*) = \gamma q_y \Delta t \Delta y \quad (3.14.3.2)$$

From equation (3.11) it can be seen that Real{A} would ideally be proportional to the product of two delta functions, i.e., $\delta(x-x^*)\delta(y-y^*)$, so that the estimate of the object density $\varrho^*(x,y)$ is equal to the actual object density $\varrho(x,y)$. This is confirmed by a Taylor series expansion of $A^{(1)}$ in a about $\alpha=0$ which provides $$A^{(1)} \sim (N+1) - \alpha^2\{(N+1)^3/6 - (N+1)^2/4 + (N+1)/12\} + \ldots, \quad (4.1)$$

showing that the magnitude of the central peak increases linearly with N, and the width of the peak goes as 1/N for large N. And, a Taylor series expansion of $A^{(2)}$ in a about $\alpha=0$ provides $$A^{(2)} \sim \alpha\{(N+1)^2/2 - (N+1)\}, \quad (4.2)$$

indicating that $A^{(2)}$ does not substantially contribute to the height or width of the central peak. Furthermore, it may be noted that since $A^{(1)}$ is an even function of $\alpha$, Real{A} is an even function of $(x-x^*)$ and $(y-y^*)$ near the central peak.

Figure 1A:
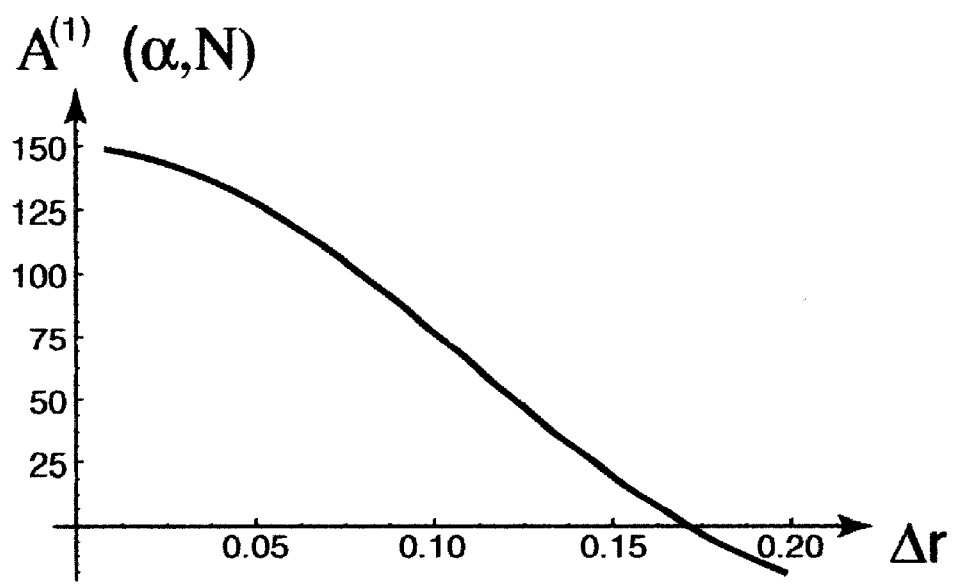
FIGS. 1A and 1B plot the function $A^{(1)}$ versus $\Delta r$ for the number of sample values N equal to 150, and FIGS. 1C and 1D plot the function $A^{(1)}$ versus $\Delta r$ for the number of sample values N equal to 450.
Figure 1B:
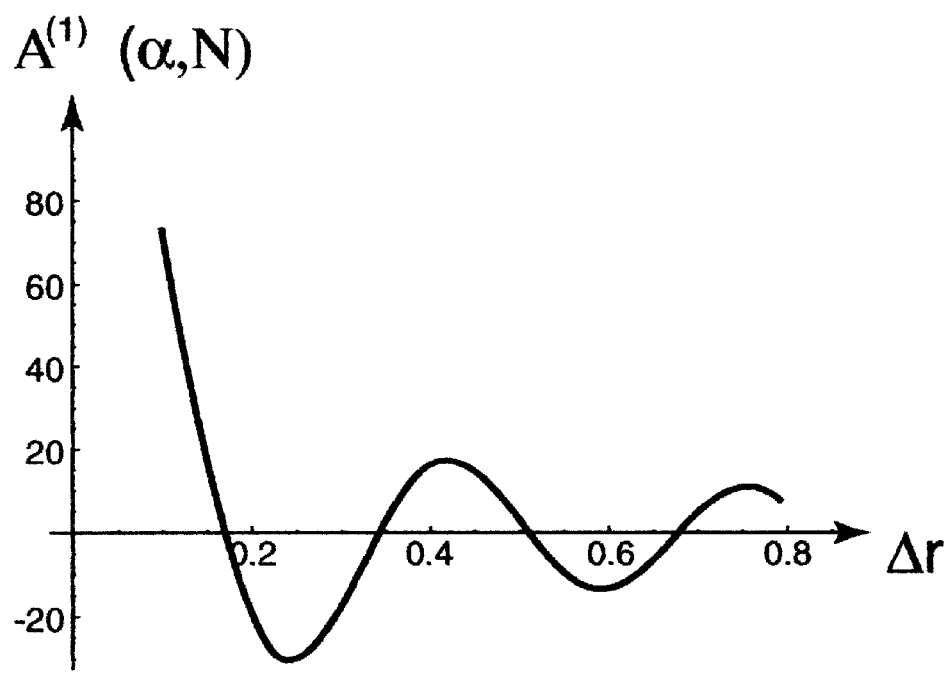
Figure 1C:
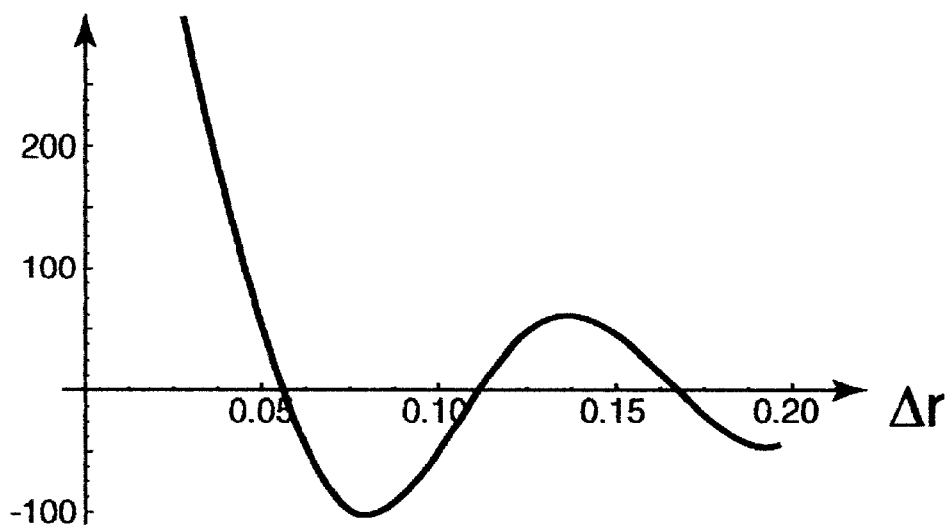
Figure 1D:
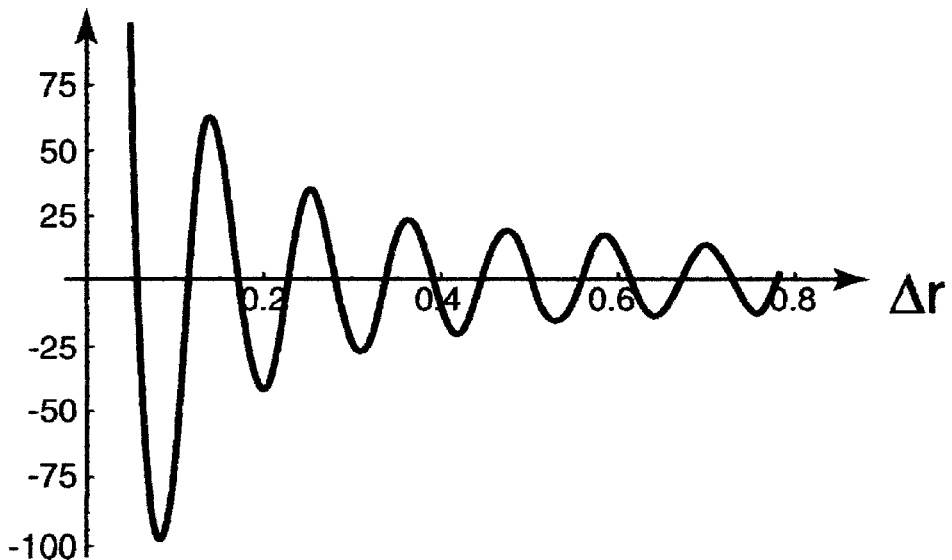

The behavior for $A^{(1)}$ is illustrated graphically by FIGS. 1A through 1D. FIGS. 1A and 1B plot $A^{(1)}$ for N=150 and $\gamma q \Delta t = 0.123$ over the ranges $0 \leq \Delta r \leq 0.2$ and $0 \leq \Delta r \leq 0.8$, respectively, and it can be seen that the function $A^{(1)}$ has a central peak with a magnitude of approximately 150 and a halfwidth of about 0.1, and the next largest extremum (located at $\alpha \approx 0.21$) has a magnitude of approximately 35. FIGS. 1C and 1D plot $A^{(1)}$ over the ranges $0 \leq \Delta r \leq 0.2$ and $0 \leq \Delta r \leq 0.8$, respectively, for the same value of $\gamma q \Delta t$ as plotted in FIGS. 1A and 1B, but with N increased to 450. Comparison of the plots of FIGS. 1C and 1D with the plots of FIGS. 1A and 1B shows that the increase in the value of N causes the central peak of the function $A^{(1)}$ to become substantially larger and narrower, and the other extrema to become smaller in relation to the central peak, so $A^{(1)}$ better approximates a delta function. In particular, in the plot of FIGS. 1C and 1D the central peak of the function $A^{(1)}$ has a magnitude of approximately 450 and a halfwidth of about 0.03, and the next largest extremum has a magnitude of approximately 100.

Figure 2A:
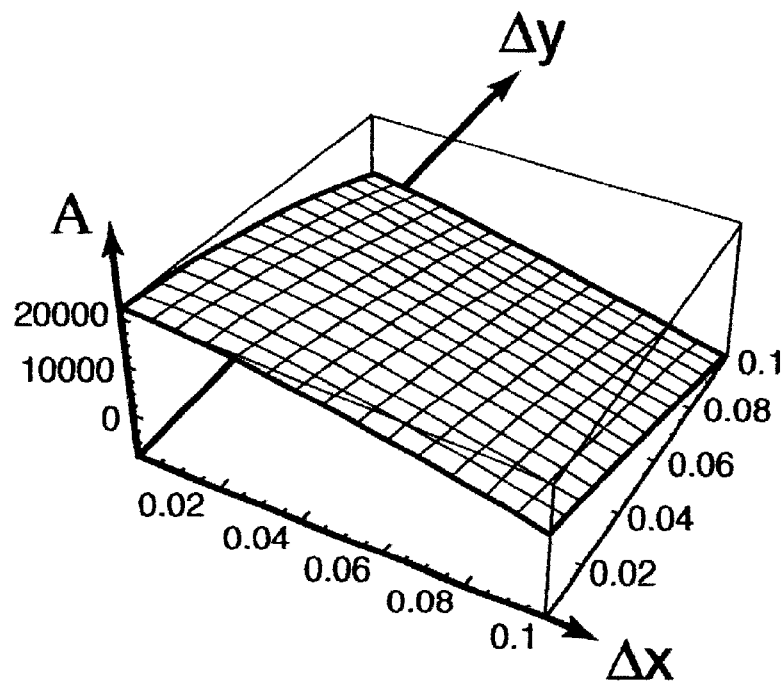
FIGS. 2A and 2B plot the kernel function $A(\alpha_x, \alpha_y)$ versus $\Delta x$ and $\Delta y$ for the number of sample values N equal to 150, and FIGS. 2C and 2D plot the function $A(\alpha_x, \alpha_y)$ versus $\Delta x$ and $\Delta y$ for the number of sample values N equal to 450.
Figure 2B:
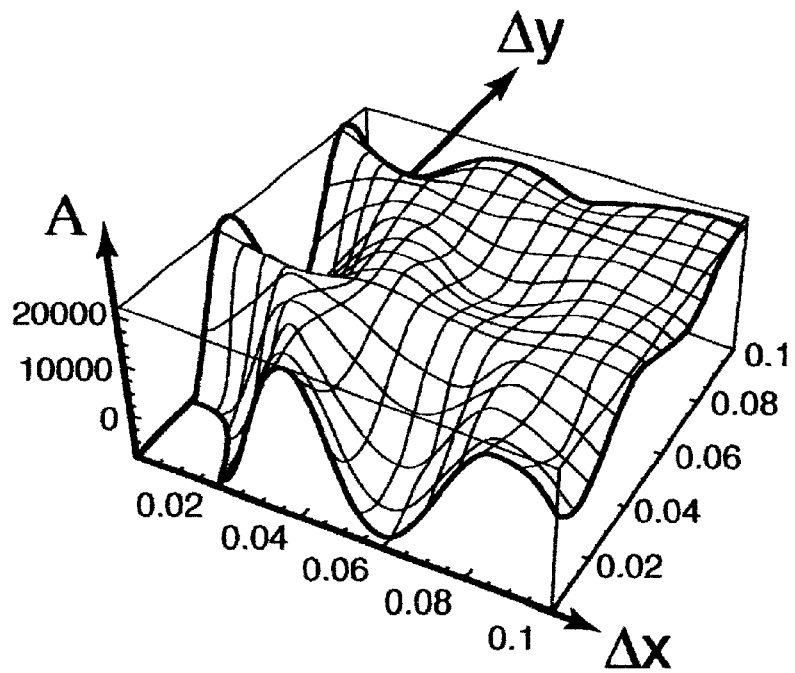
Figure 2C:
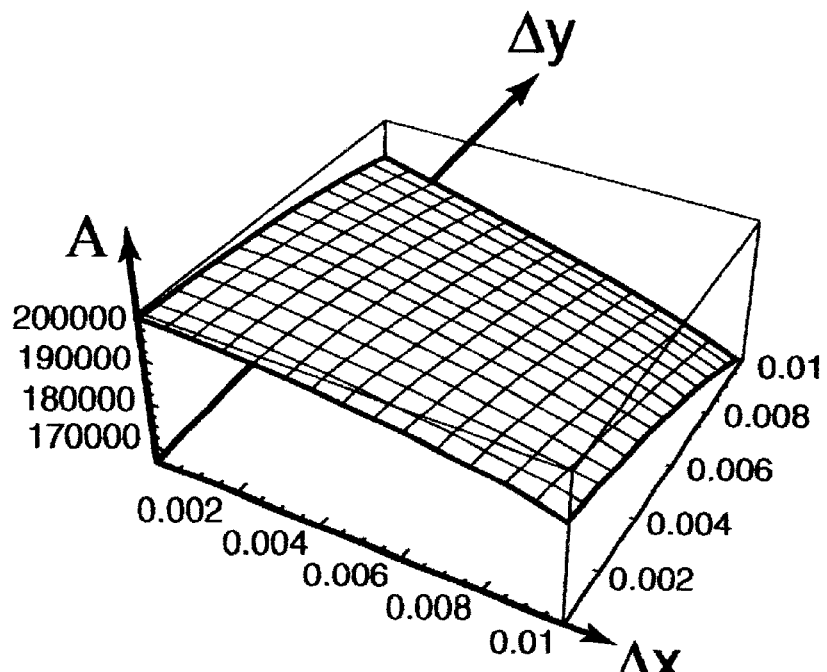
Figure 2D:
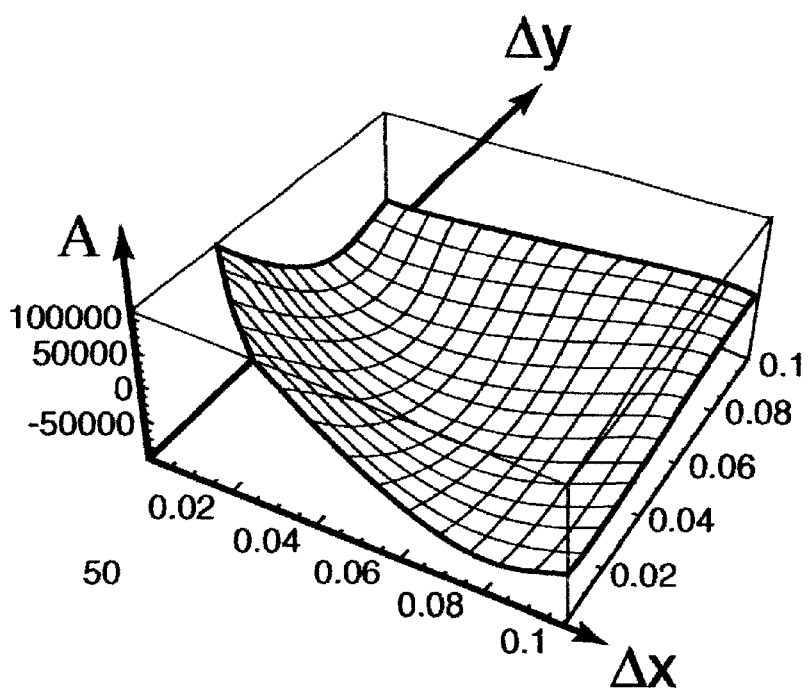

Three-dimensional plots of $A(\alpha_x, \alpha_y)$ versus $\Delta x$ and $\Delta y$ are shown in FIGS. 2A through 2D, with $q_x$ taken as equal to $q_y$, i.e., $q_x = q_y \equiv q$, and $N_x$ taken as equal to $N_y$, i.e., $N_x = N_y \equiv N$, further confirm that $A(\alpha_x, \alpha_y)$ becomes an increasingly effective approximation of the product of delta functions $\delta(\alpha_x)$ and $\delta(\alpha_y)$ as N becomes large. As shown by FIGS. 2A and 2B which plot $A(\alpha_x, \alpha_y)$ versus $\Delta x$ and $\Delta y$ for N=150 and $\gamma q_x \Delta t = 0.123$ over the ranges $0 \leq \Delta x, \Delta y \leq 0.1$ and $0 \leq \Delta x, \Delta y \leq 0.8$, respectively, the central peak has a magnitude of approximately 20,000 and a halfwidth of approximately 0.05, and the oscillations in magnitude decay to values which are a tenth as large by $\Delta x = \Delta y = 0.5$. As shown by FIGS. 2C and 2D which plot A over the ranges $0 \leq \Delta x, \Delta y \leq 0.01$ and $0 \leq \Delta x, \Delta y \leq 0.1$, respectively, when N is increased by a factor of three to N=450 for the same value of $\gamma q_x \Delta t$, the central peak has a magnitude of approximately 202,000, and a halfwidth of approximately 0.02 which is approximately one third as wide.

As can be seen from the plots of FIGS. 1A–1D and FIGS. 2A–2D, for finite N the value of the calculated object density $\varrho^*$ at (x,y) determined via equation (3.11) is dependent not only on the value of the actual object density $\varrho$ in the neighborhood of (x,y) due to the contribution of the central peak of A, but also on the actual object density $\varrho$ in regions away from (x,y) due to contributions from other extrema of the kernel A. According to a first embodiment of the method of the present invention, compensation is provided to counter the contributions to the estimated object density $\varrho^*$ from nonzero regions outside the central peak of the kernel A to produce an increase in accuracy. According to the present invention, the integral of equation (3.11) is discretized as $$\varrho^*(x_i, y_j) = \sum_{k,l} B_{i,j,k,l} \varrho(x_k, y_l), \quad (5.1)$$

where the sample plane is divided into a P×P grid of grid rectangles of dimension $\delta x \times \delta y$, and the kernel matrix B is calculated according to the method of the present invention $$B_{k,l}^{ij} \equiv B(x_i, y_j, x_k, y_l) = \int A(x, y, i \times \delta x, j \times \delta y) dx\, dy, tm\ (5.2)$$

with the integral being taken over a $\delta x \times \delta y$ by grid rectangle centered about coordinates ($k \times \delta x, l \times \delta y$). The integrations may be performed using a numerical integration routine, such as the programs provided in chapter 4 of *Numerical Recipes*, by William H. Press, Brian P. Flannery, Saul A. Teukolsky and William T. Vetterling, Cambridge University Press, Cambridge, 1986, which is incorporated herein by reference. Although the kernel function A is depicted as being a function of two spatial variables in equations (3.11) and (3.12), the kernel function A is depicted as being a function of four spatial variables in equation (5.2). As discussed in reference to equation (6.3) below, this is because the spatial dependence of the relaxation time $T_2$ has been ignored in the derivation of equations (3.11) and (3.12).

According to the first preferred embodiment depicted in FIG. 3A, an increased-accuracy object density $\varrho^{**}(x,y)$ is then obtained 720 by taking linear combinations of the estimated object density $\varrho^*(x)$ according to $$\varrho^{**}(x_i, y_j) = \sum_{k,l} B^{-1}(x_i, y_j, x_k, y_l) \varrho^*(x_k, y_l) \quad (5.3)$$

The inverse of matrix B may be determined using a matrix inversion routine, such as the programs of chapter 2 of Numerical Recipes, which is incorporated herein by reference.

As noted above, the assumption that $T_2$ is independent of position was made when the factor $\exp\{(i\omega_0 - 1/T_2)t\}$ was taken outside the integral in equation (3.8). However, as has been determined from experimental work on isolated samples of normal and ischemic tissue, $T_2$ varies as a function of the material or between normal and ischemic regions, so, for example, the $T_2$ relaxation time differs between the myocardium and the internal blood-filled cavity. Therefore, if the position dependence of $T_2$ (i.e., the dependence of $T_2$ on actual object density $\varrho$, which is in turn dependent on position) is taken into account, the expression for $M(n_1, n_2)$ is actually $$M(n_1, n_2) = \int \varrho(x, y) e^{(i\omega_0 - 1/T_2(x,y))(n_1+n_2)\Delta t} e^{i\gamma q_x x n_1 \Delta t} e^{i\gamma q_y y n_2 \Delta t} dx dy \quad (6.1)$$

Then the density is approximated by $$\varrho^*(x^*, y^*) = \text{Real}\left\{\sum_{n_1=0}^{N_1} \sum_{n_2=0}^{N_2} e^{-(i\omega_0 - 1/[T_2])(n_1+n_2)\Delta t} \times \right. \quad (6.2)$$

$$\left. e^{-i\gamma q_x x^* n_1 \Delta t} e^{-i\gamma q_x x^* n_1 \Delta t} M(n_1, n_2)\right\},$$

where $[T_2]$ is a characteristic relaxation time, such as an estimated mean value of $T_2(x,y)$ over the range of integration based on a guess as to the percentage of normal tissue and the value of the relaxation time in normal tissue $T_2^{(n)} \equiv T_2(\varrho^{(n)})$, and the percentage of ischemic tissue and the value of the relaxation time in ischemic tissue $T_2^{(i)} \equiv T_2(\varrho^{(i)})$. The proper expression for the kernel A is then $$A(x, y, x^*, y^*) = \left(\sum_{n_1=0}^{N_x} e^{i\gamma q_x n_1 \Delta t(x-x^*)} e^{n_1 \Delta t[1/[T_2]-1/T_2(x,y)]}\right) \times \quad (6.3)$$

$$\left(\sum_{n_2=0}^{N_y} e^{i\gamma q_y n_2 \Delta t(y-y^*)} e^{n_2 \Delta t[1/[T_2]-1/T_2(x,y)]}\right).$$

Defining $$\tau \equiv \{\Delta t/[T_2] - \Delta t/T_2(x,y)\} \quad (6.4)$$

and applying trigonometric identities to equation (6.3), the kernel A can be written as $$A = A^{(1)}(\alpha_x, \tau) A^{(1)}(\alpha_y, \tau) - A^{(2)}(\alpha_x, \tau) A^{(2)}(\alpha_y, \tau) \quad (6.5)$$

where $$A^{(1)}(\alpha, t) \equiv \frac{(1 - e^{-(N+1)\tau} \cos(\alpha(N+1)) \cdot (1 - e^{-\tau}\cos\alpha) +}{(1 - e^{-\tau}\cos\alpha)^2 + e^{-2\tau}\sin^2\alpha} \quad (6.6.1)$$

$$\frac{e^{-(N+1)\tau}\sin(\alpha(N+1)) \cdot \sin\alpha}{(1 - e^{-\tau}\cos\alpha)^2 + e^{-2\tau}\sin^2\alpha}$$

and $$A^{(2)}(\alpha, t) \equiv \frac{(1 - e^{-(N+1)\tau}\cos(\alpha(N+1)) \cdot e^{-\tau}\sin\alpha -}{(1 - e^{-\tau}\cos\alpha)^2 + e^{-2\tau}\sin^2\alpha} \quad (6.6.2)$$

$$\frac{e^{-(N+1)\tau}\sin(\alpha(N+1)) \cdot (1 - e^{-\tau}\cos\alpha)}{(1 - e^{-\tau}\cos\alpha)^2 + e^{-2\tau}\sin^2\alpha}$$

According to a preferred embodiment of the present invention, the dwell time $\Delta t$ is chosen to be short relative to the relaxation time $T_2$, and N is chosen to be small enough that the factors of $e^{-\tau}$ and $e^{-(N+1)\tau}$ can be taken as equal to unity, i.e., $$|1 - e^{-\tau}| << 1 \quad (6.7.1)$$

and $$|1 - e^{-(N+1)\tau}| << 1, \quad (6.7.2)$$

and so to zeroth order the $\tau$ dependence can be neglected. Preferably, $|1 - e^{-(N+1)\tau}|$ is less than 0.1, more preferably less than 0.03, even more preferably less than 0.001, even more preferably less than 0.0003, still more preferably less than 0.0001, and even still more preferably less than 0.00003. For instance, $T_2$ is typically 1/10th of a second. If $[T_2]$ is taken as 0.1 seconds and $T_2(x,y)$ varies by 10% (e.g., $T_2(x,y)$ has a value 0.11 seconds), then for a dwell time of $2\times10^{-6}$ seconds, $\tau \approx 1.8\times10^{-6}$ and $e^{-\tau} \approx 0.9999982$. Even for N as large as 160, $e^{-(N+1)\tau} \approx 0.99971$, and so is clearly still close enough to a value of unity to be taken as such. Therefore, plots of $A^{(1)}(\alpha, \tau)$ for $N \approx 160$, $[T_2] = 0.1$ seconds and $T_2(x,y) = [T_2] \pm 10\%$, are not visibly discernable from the plots of $A^{(1)}(\alpha, 0)$ of FIGS. 1A–D.

The heart is a particularly difficult organ to image with MRI because it is constantly in motion. For instance, data acquisition for imaging of the human heart must be performed within 1/20th of a second. It is therefore required that the total number of samples $N^2$ multiplied by the dwell time $\Delta t$ is less than or equal to 0.05 seconds. For instance, for an apparatus with a dwell time $\Delta t$ of two microseconds, N must be less than or equal to 158 if the condition $|1 - e^{-(N+1)\tau}| << 1$ is to be satisfied. However, other organs or parts of the anatomy do not move as rapidly and so the value of N, and therefore the spatial resolution, does become limited by the condition $|1 - e^{-(N+1)\tau}| << 1$.

As depicted in the flowchart of the method of the present invention of FIG. 3B, once the estimated object density $\varrho^*(x,y)$ has been calculated 820 according to equation (6.2), then ischemic and normal regions of the myocardium may be mapped 825 by determining boundaries between normal regions which have a standard object density value $\varrho_n$ and ischemic regions which have a reduced object density value $\varrho_i$. It should be understood that according to the lexography of the present specification, on proceeding from the calculation 815 of the transform E via process path 816 to step 820 to FIG. 3B, the 'current-best' estimated object density $\varrho_b^*(x,y)$ is the estimated object density $\varrho^*(x,y)$ as given by equation (6.2) where the calculation simply uses the the average relaxation time $[T_2]$.

Figure 4:
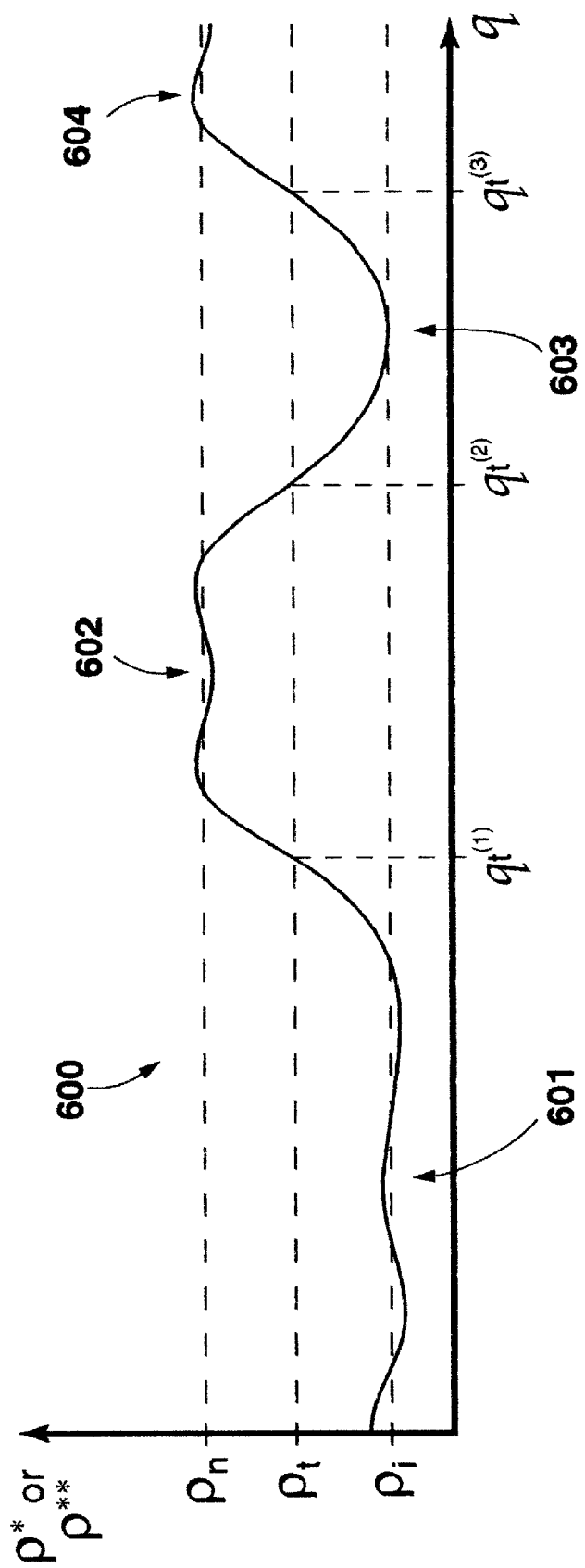
FIG. 4 depicts an exemplary graph of estimated object density or increased-accuracy object density as a function of position along an axis to illustrate how transitions between normal and ischemic regions can be determined.

An exemplary profile 600 of an estimated object density $\varrho^*$ or increased-accuracy object density $\varrho^{}$ along an axis labelled as q is shown in FIG. 4. The object density goes from a reduced object density value $\varrho_i$ in a first region 601 having a low value of q, to a normal object density value $\varrho_n$ in a second region 602 having an intermediate value of q, to another reduced object density value $\varrho_i$ in a third region 603 having a higher value of q, to another normal object density value $\varrho_n$ in a fourth region 604** in a range of still higher q values. Along the q axis, the transition points from normal to ischemic regions may be ascertained by, for instance, noting where the estimated or increased-accuracy object density $\varrho^*$ or $\varrho^{}$ reaches a transition value $\varrho_t$. In the exemplary case of FIG. 4**, the estimated or increased-accuracy object density $\varrho^*$ or $\varrho^{}$ reaches the transition value $\varrho_t$ at points $q_t^{(1)}$, $q_t^{(2)}$, $q_t^{(3)}$ and $q_t^{(4)}$. For an actual three-dimensional sample, transition points throughout the space of the sample are used to determine the transition surfaces between the normal and ischemic regions 825**.

With this knowledge of the locations of the normal and ischemic regions, the calculation of the estimated object density $\varrho^*$ of equation (6.2) can be improved by using a value for the relaxation time $T_2$ appropriate for the location (x,y) at which the estimated object density $\varrho^*(x,y)$ is to be determined. That is, a corrected transform function $E_c$ can be determined 830 and used in place of the transform function $$E = e^{-(i\omega_o - 1/[T_2])(n_1 + n_2)\Delta t} \; e^{-i\gamma q_x x n_1 \Delta t} \; e^{-i\gamma q_y y n_2 \Delta t} \quad (7.1)$$

of equation (6.2) to calculate 820 a corrected estimated object density $\varrho_c^*$. In particular, the corrected transform function $E_c$ is given by $$E_c = e^{-(i\omega_o - 1/T_2^{(i)})(n_1 + n_2)\Delta t} \; e^{-i\gamma q_x x n_1 \Delta t} \; e^{-i\gamma q_y y n_2 \Delta t} \quad (7.2)$$

when position (x,y) is located in an ischemic region, and $$E_c = e^{-(i\omega_o - 1/T_2^{(n)})(n_1 + n_2)\Delta t} \; e^{-i\gamma q_x x n_1 \Delta t} \; e^{-i\gamma q_y y n_2 \Delta t} \quad (7.3)$$

when position (x,y) is located in an ischemic region. On proceeding via process path 831 to a second execution of step 820, the corrected transform function $E_c$ is now referred to according to the lexography of the present specification as the 'current-best' transform function $E_b$, and the calculated estimated object using the current-best transform function $E_b$ is referred to as the current-best object density $\varrho_b^*$. The current-best object density $\varrho_b^*(x,y)$ is calculated 820 according to $$\varrho_b^*(x,y) = \sum_{n_1=0}^{N_x} \sum_{n_2=0}^{N_y} e^{-(i\omega_o - 1/T_2^{(i)})(n_1 + n_2)\Delta t} \; e^{-i\gamma q_x x n_1 \Delta t} \; e^{-i\gamma q_y y n_2 \Delta t} \; M(n_1, n_2) \quad (7.4)$$

when (x,y) is located in an ischemic region, and $$\varrho_b^*(x,y) = \sum_{n_1=0}^{N_x} \sum_{n_2=0}^{N_y} e^{-(i\omega_o - 1/T_2^{(n)})(n_1 + n_2)\Delta t} \; e^{-i\gamma q_x x n_1 \Delta t} \; e^{-i\gamma q_y y n_2 \Delta t} \; M(n_1, n_2) \quad (7.5)$$

when (x,y) is located in a normal region.

The methods depicted in FIGS. 3A and 3B represent first-order corrections to the estimation of the actual object density $\varrho$. In some instances the method of FIG. 3A will provide a more accurate determination of the actual object density $\varrho$, in some instances the method of FIG. 3B will provide a more accurate determination of the actual object density $\varrho$, and in still other instances the methods of FIGS. 3A and 3B will be roughly comparable.

According to the present invention, one may achieve second-order (or even higher order) corrections to the determination of actual object density $\varrho$ by two (or more) passes through the loop 820–821–825–826–830–831 of FIG. 3B. In this case, the second determination 825 of the normal and ischemic regions uses the corrected estimated object density $\varrho_c^*$ as the current-best estimated object density $\varrho_b^*$, the second calculation of the corrected transform $E_c$ uses the revised determination of the normal and ischemic regions, and the second calculation of the estimated object density $\varrho^*$ uses new corrected transform $E_c$ as the current-best transform $E_b$.

Also, as shown in the flowchart of FIG. 3C, one may achieve second-order (or even higher order) corrections to the determination of actual object density through the use of a combination of both the method of FIG. 3A and the method of FIG. 3B. As with the methods of FIGS. 3A and 3B, the method of FIG. 3C begins with the extraction of magnetization data 910, the calculation 915 of the transform E is made using an average value of the object density $\varrho$, and on the first execution of step 920 the estimated object density $\varrho^*$ is determined according to equation (6.2).

Then, the choice 955 may be made to proceed via process path 957 to the estimation 925 of the normal and ischemic regions, or to proceed via process path 956 to calculate 940 an improved-accuracy object density $\varrho^{**}$ by applying the inverse of the kernel matrix B to the estimated object density $\varrho^*$. If the choice 955 is made 957 to proceed to the estimation 925 of the normal and ischemic regions, then the current-best estimated object density $\varrho_b^*$ is simply the estimated object density $\varrho^*$ determined according to equation (6.2). Similarly, if the choice 955 is made 956 to proceed to the calculation 940 of the improved-accuracy object density $\varrho^{**}$, then the current-best estimated object density $\varrho_b^*$ is again the estimated object density $\varrho^*$ determined according to equation (6.2), and the current-best improved-accuracy object density $\varrho_b^{}$ is the improved-accuracy object density $\varrho^{}$ determined according to equation (5.3).

If the choice 955 was made to initially proceed via process path 957 to the estimation 925 of the normal and ischemic regions, then the corrected transform $E_c$ is calculated as described above in reference to FIG. 3B, and a new estimated object density $\varrho^*$, termed the 'current-best' estimated object density $\varrho_b^*$, is determined using the corrected transform $E_c$ as described above in reference to FIG. 3B. Then, the choice may again be made as to whether to proceed via process path 957 to another estimation 925 of the normal and ischemic regions, or to proceed via process path 956 to a calculation 940 of an improved-accuracy object density $\varrho^{**}$ by applying the inverse of the kernel matrix B to the estimated object density $\varrho^*$. The situation where the choice 955 is made to again proceed via process path 957 to obtain an improved estimation 925 of the normal and ischemic regions is described above in reference to FIG. 3B. If the choice is made to proceed via process path 956 to a calculation 940 of an improved-accuracy object density $\varrho^{**}$, then the corrected transform $E_c$ is the current-best transform $E_b$ used to produce a current-best kernel matrix $B_b$, and the corrected estimated object density $\varrho_c^*$ is the current-best estimated object density $\varrho_b^*$, and the current-best improved-accuracy object density $\varrho_b^{}$ is calculated according to $\varrho_b^{}=B_b^{-1}\varrho_b^*$.

Alternatively, if the initial choice 955 was made to proceed via process path 956 to the calculation of an improved-accuracy object density $\varrho^{}$ using the kernel matrix B, as described above in reference to FIG. 3A, then a second-order correction may be achieved by proceeding via process path 941 to the estimation 925 of the normal and ischemic regions. In this case, the estimation 925 would use the current-best improved-accuracy object density $\varrho_b^{}$, which is the improved-accuracy object density $\varrho^{**}$. Then, a corrected transform $E_c$ is calculated 930, and the corrected transform $E_c$ is the current-best transform applied to the magnetization M to calculate 920 another estimated object density $\varrho^*$, which becomes the current-best estimated object density $\varrho_b^*$.

In this manner arbitrarily-high-order corrections to the estimation of the object density $\varrho^*$, may be achieved. By monitoring the amount of change between successive corrections, it may be determined when the amount of computation required for an additional increment in the order of the correction is not warranted.

Methods for rapid, high-accuracy magnetic resonance imaging have therefore been described in the present specification. Although the above description contains many specificities, these should not be construed as limiting the scope of the invention, but as merely providing illustrations of some of the preferred embodiments of this invention. Many variations are possible and are to be considered within the scope of the present invention. For instance, although the present invention has been described in terms of magnetic resonance imaging using the inversion recovery technique over two-dimensional samples, it should be understood that the present invention can be applied to any imaging method where a measured variable M as a function of a first variable t is related to an actual object density $\varrho$ by an integration over space q using a transform function F(t,q), i.e., $M(t)=\int F(t, q)\varrho(q)dq$, where the actual object density $\varrho$ may be estimated by an inversion using a transform E(t,q), i.e., $\varrho^*(q)=\Sigma_t E(t,q)M(t)$.

Furthermore, it should be noted that while some aspects of the present invention are described in terms of the imaging of the heart for convenience, and particularly to emphasize the usefulness of the present invention for rapid imaging, the present invention may be applied to the imaging of any organs or biological tissues, or any materials with variations in material density and/or relaxation times. Other variations which are possible and are to be considered within the scope of the present invention include: an imaging technique other than magnetic resonance imaging may be used; an imaging technique other than the inversion recovery technique may be used; a spin-echo technique may be used; the method may be applied to one-dimensional or three-dimensional sections of the sample; the data values may not be dependent on a variable other than time; electromagnetic pulses may use frequencies that target nuclei other than the hydrogen nucleus; the method may be used to differentiate between other types of normal and abnormal tissue other than normal and ischemic tissue in the myocardium; etc. Thus the scope of the invention should be determined not by the examples given herein, but rather by the appended claims and their legal equivalents.

What is claimed is:

1. A method for producing an increased-accuracy object density $\varrho^{**}$ of an object from an estimated object density $\varrho^*$ by compensating for spatial mixing involved in estimating an actual object density $\varrho$ from imaging data values M extracted from said object, where said imaging data values M as a function of time t are related to an integration of said actual object density $\varrho$ over a space represented by a spatial variable q with a weighted by a first transform function F(q,t) according to $$M(t)=\int F(q,t)\varrho(q)dq,$$

and said estimated object density $\varrho^*$ is related to said imaging data values M(t) by a sum weighted by a second transform function E(q,t) according to $$\varrho^*(q)=\Sigma_t E(q,t)M(t),$$

comprising the steps of:

forming a kernel function A(q,q') according to $$A(q,q')=\Sigma_t F(q',t)E(q,t),$$

which approximates a delta function $\delta(q-q')$;

discretizing said kernel function A(q,q') to provide a kernel matrix B(q,q'); and computing an increased-accuracy object density $\varrho^{}$ according to $$\varrho^{}(q)=\Sigma_q B^{-1}(q,q')\varrho(q').$$

2. The method of claim 1 wherein said imaging data values M(t) are magnetic resonance imaging data.

3. The method of claim 1 wherein said spatial variable q is a two-dimensional variable.

4. A method for producing a corrected object density $\varrho_c^*$ of an object from an estimated object density $\varrho^*$ using said estimated object density $\varrho^*$, where imaging data values M as a function of time t are related to an integration of said actual object density $\varrho$ over a space represented by a spatial variable q with a weighted by a first transform function F(q,t) according to $$M(t)=\int F(\varrho(q),q,t)\varrho(q)dq,$$

and said estimated object density $\varrho^*$ is related to said imaging data values M(t) by a sum weighted by a second transform function E(q,t) according to $$\varrho^*(q)=\Sigma_t E([\varrho],q,t)M(t),$$

where square brackets indicate that a characteristic value of a variable within said square brackets is used, comprising the steps of:

producing estimated boundaries of regions of normal tissue and abnormal tissue based on values of said estimated object density $\varrho^*$;

generating a corrected second transform $E_c$ using said estimated boundaries of said normal tissue and said abnormal tissue; and calculating said corrected estimated object density $\varrho_c^*$ with a summation over said imaging data values $M(t)$ weighted by said corrected second transform $E_c$ according to $\varrho_c^*(q)=\Sigma_t E_c(t)M(t)$.

5. The method of claim 4 wherein said imaging data values $M(t)$ are magnetic resonance imaging data.

6. The method of claim 4 wherein said spatial variable q is a two-dimensional variable.

7. A method for producing a corrected increased-accuracy object density $\varrho_c^{**}$ of an object from an estimated object density $\varrho^*$, where imaging data values M as a function of time t are related to an integration of said actual object density $\varrho$ over a space represented by a spatial variable q with a weighted by a first transform function $F(q,t)$ according to $M(t)=\int F(\varrho(q),q,t)\varrho(q)dq$, and said estimated object density $\varrho^*$ is related to said imaging data values $M(t)$ by a sum weighted by a second transform function $E(q,t)$ according to $\varrho^*(q)=\Sigma_t E([\varrho],q,t)M(t)$, where square brackets indicate that a characteristic value of a variable within said square brackets is used, so that said estimated object density $\varrho^*$ is related to said actual object density $\varrho$ by an integration weighted by a kernel function $A(q,q')$ which approximates a delta function $\delta(q-q')$ according to $\varrho^*(q)=\int A(q,q')\varrho(q')dq'$ where said kernel function $A(q,q')$ is given by $A(q,q')\equiv\Sigma_t E([\varrho],q,t)F(\varrho(q'),q',t)$, comprising the steps of:

discretizing said kernel function $A(q,q')$ to produce a kernel matrix $B(q,q')$;

calculating an increased-accuracy object density $\varrho^{}$ by application of an inverse of said kernel matrix to said actual object density $\varrho$ according to $\varrho^{}(q)=\Sigma_q B^{-1}(q,q')\varrho(q')$;

producing estimated boundaries of regions of normal tissue and abnormal tissue based on values of said increased-accuracy object density $\varrho^{**}$;

generating a corrected second transform $E_c$ using said estimated boundaries of said normal tissue and said abnormal tissue; and calculating said corrected increased-accuracy object density $\varrho_c^{}$ by a summation over said imaging data values $M(t)$ weighted by said corrected second transform $E_c$ according to $\varrho_c^{}(q)=\Sigma_t E_c M(t)$.

8. The method of claim 7 wherein said imaging data values $M(t)$ are magnetic resonance imaging data.

9. The method of claim 7 wherein said spatial variable q is a two-dimensional variable.

10. A method for producing a second-order corrected estimated object density $\varrho_{cc}^*$ of an object from an estimated object density $\varrho^*$, where imaging data values M as a function of time t are related to an integration of said actual object density $\varrho$ over a space represented by a spatial variable q with a weighted by a first transform function $F(q,t)$ according to $M(t)=\int F(\varrho(q),q,t)\varrho(q)dq$, and said estimated object density $\varrho^*$ is related to said imaging data values $M(t)$ by a sum weighted by a second transform function $E(q,t)$ according to $\varrho^*(q)=\Sigma_t E([\varrho],q,t)M(t)$, where square brackets indicate that a characteristic value of a variable within said square brackets is used, so that said estimated object density $\varrho^*$ is related to said actual object density $\varrho$ by an integration weighted by a kernel function $A(q,q')$ which approximates a delta function $\delta(q-q')$ according to $\varrho^*(q)=\int A(q,q')\varrho(q')dq'$ where said kernel function $A(q,q')$ is given by $A(q,q')\equiv\Sigma_t E([\varrho],q,t)F(\varrho(q'),q',t)$, comprising the steps of:

producing first estimated boundaries of regions of normal tissue and abnormal tissue based on values of said estimated object density $\varrho^*$;

generating a corrected second transform $E_c$ using said first estimated boundaries of said normal tissue and said abnormal tissue;

calculating a corrected estimated object density $\varrho_c^*$ by summation over said imaging data values $M(t)$ weighted by said corrected second transform $E_c$ according to $\varrho_c^*(q)=\Sigma_t E_c M(t)$;

producing second estimated boundaries of regions of normal tissue and abnormal tissue based on values of said corrected estimated object density $\varrho_c^*$;

generating a second-order corrected second transform $E_{cc}$ using said second estimated boundaries of said normal tissue and said abnormal tissue;

calculating said second-order corrected estimated object density $\varrho_{cc}^*$ by summation over said imaging data values $M(t)$ weighted by said second-order corrected second transform $E_c$ according to $\varrho_{cc}^*(q)=\Sigma_t E_{cc} M(t)$.

11. The method of claim 10 wherein said imaging data values $M(t)$ are magnetic resonance imaging data.

12. The method of claim 10 wherein said spatial variable q is a two-dimensional variable.

13. A method for producing a increased-accuracy corrected object density $\varrho_c^{**}$ of an object from an estimated object density $\varrho^*$, where imaging data values M as a function of time t are related to an integration of said actual object density $\varrho$ over a space represented by a spatial variable q with a weighted by a first transform function $F(q,t)$ according to $M(t)=\int F(\varrho(q),q,t)\varrho(q)dq$, and said estimated object density $\varrho^*$ is related to said imaging data values $M(t)$ by a sum weighted by a second transform function $E(q,t)$ according to $\varrho^*(q)=\Sigma_t E([\varrho],q,t)M(t)$, where square brackets indicate that a characteristic value of a variable within said square brackets is used, so that said estimated object density $\varrho^*$ is related to said actual object density $\varrho$ by an integration weighted by a kernel function $A(q,q')$ which approximates a delta function $\delta(q-q')$ according to $$\varrho^*(q) = \int A(q,q')\varrho(q')dq'$$

where said kernel function $A(q,q')$ is given by $$A(q,q') \equiv \Sigma_t E([\varrho],q,t) F(\varrho(q'),q',t),$$

comprising the steps of:

producing estimated boundaries of regions of normal tissue and abnormal tissue based on values of said estimated object density $\varrho^*$;

generating a corrected second transform function $E_c(t)$ using said estimated boundaries of said normal tissue and said abnormal tissue;

calculating a corrected estimated object density $\varrho_c^*$ by summation over said imaging data values $M(t)$ weighted by said corrected second transform function $E_c(t)$ according to $$\varrho_c^*(q) = \Sigma_t E_c(t) M(t);$$

generating a corrected kernel function $A_c(q,q')$ by summation over time t of said corrected second transform function $E_c$ and said first transform function F according to $$A_c(q,q') = \Sigma_t F(q',t) E_c(q,t),$$

discretizing said corrected kernel function $A(q,q')$ to produce a corrected kernel matrix $B(q,q')$; and calculating said increased-accuracy corrected object density $\varrho_c^{**}$ by application of an inverse of said corrected kernel matrix $B(q,q')$ to said corrected estimated object density $\varrho_c^*$ according to $$\varrho_c^{**}(q) = \Sigma_{q'}[B_c(q,q')]^{-1}\varrho(q').$$

14. The method of claim 13 wherein said imaging data values $M(t)$ are magnetic resonance imaging data.

15. The method of claim 13 wherein said spatial variable q is a two-dimensional variable.

* * * * *